United States Patent [19]

Kimsey

[11] 4,267,514

[45] May 12, 1981

[54] DIGITAL PHASE-FREQUENCY DETECTOR

[75] Inventor: Thomas H. Kimsey, Columbia, Md.

[73] Assignee: The United States of America as represented by the Secretary of the Air Force, Washington, D.C.

[21] Appl. No.: 12,697

[22] Filed: Feb. 16, 1979

[51] Int. Cl.³ .......................... H03L 7/00; H03K 5/26
[52] U.S. Cl. ................................. 328/133; 307/528; 328/110
[58] Field of Search ...................... 328/133, 134, 110; 307/232; 331/1 A

[56] References Cited

U.S. PATENT DOCUMENTS

| | | | |
|---|---|---|---|
| 3,610,954 | 10/1971 | Treadway | 307/232 |
| 3,688,202 | 8/1972 | Naubereit et al. | 328/133 |
| 3,755,746 | 8/1973 | Hogue et al. | 328/133 |
| 4,020,422 | 4/1977 | Underhill | 328/133 |
| 4,105,947 | 8/1978 | Crowley | 331/1 A |
| 4,122,405 | 10/1978 | Tietz et al. | 331/1 A |

Primary Examiner—John S. Heyman
Attorney, Agent, or Firm—Donald J. Singer; Henry S. Miller

[57] ABSTRACT

A digital phase-frequency detector which provides rapid frequency acquisition and phase control when used in phase-locked loop applications. In a locked condition the output of a pair of flip-flop circuits are high causing an EXOR gate to produce a detector output, when unlocked a phase difference will increase until the higher frequency exhibits two positive transitions before one positive transition of the lower frequency can propagate through the circuit, this will cause the flip-flop receiving the higher frequency to change state thereby preventing the EXOR gate from gating and the other flip-flop from changing state, the flip-flop therefore controls the detector output until the two input freqencies again coincide and the output controlled by the EXOR gate.

5 Claims, 2 Drawing Figures

DIGITAL PHASE-FREQUENCY DETECTOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to phase-frequency detection and more particularly to a digital phase-frequency detector.

Phase-locked loops are well known in the art and are electronic circuits for locking an oscillator in phase with an arbitrary input signal. The phase-locked loop is utilized in two fundamentally different ways; first as a demodulator, where it is employed to follow (and demodulate) frequency or phase modulation, and second to track a carrier or synchronizing signal which may vary in frequency with time.

An essential part of the phase-locked loop is the phase angle ($\phi$) detector. Phase-locked loop performance is dependent on the loop's ability to control the frequency and phase of the voltage-controlled oscillator output. The typical phase detector adequately controls the output frequency and phase relationships when the loop is in the locked condition. However, when the loop is out of lock, i.e., the input reference signal and the loop output signal have a different frequency and phase relationship, acquisition and lock out of the input reference becomes a relatively slow process.

Under these conditions the output of this type of detector is in the form of one error beat frequency which slowly adjusts the output frequency in the proper direction. A more desirable phase detector output, under these conditions, would be a voltage which would move the output frequency in the proper direction at an increased rate.

A currently available phase-frequency detector that will correct a frequency difference more quickly than other known detectors is the Motorola MC-12040 (R) phase-frequency detector. The disadvantage of this and similar detectors is a condition which occurs when the phase locked loop is locked and no phase error exists. This design of phase detector exhibits a "dead zone" in which the phase of the loop's output is not tightly controlled. The "dead zone" is an undesirable characteristic because a lack of phase control will, with substantial probability, result in phase jitter, an undesirable characteristic well known in the art.

The phase-frequency detector described herein exhibits rapid acquisition with accurate control of phase thus eliminating any "dead zone" and the possibility of phase jitter.

SUMMARY OF THE INVENTION

The invention relates to a digital phase-frequency detector circuit for use in phase-locked loop applications. The circuit is characterized by fast acquisition time and accurate control of phase with no "dead zone" and accompanying phase jitter.

In accomplishing this result the invention employs two flip-flops in conjunction with an exclusive or (EXOR) gate, coupled to the output of the phase-frequency detector. With the detector in the locked condition, outputs of the two flip-flops are high causing the EXOR gate to be gated to the output of the detector. In an unlocked condition, there is a phase difference in the input frequencies which will increase until the higher frequency has two positive transitions before a positive transition on the lower frequency can propagate through the circuit. This condition will cause one flip-flop receiving the higher frequency, to change state thereby preventing the EXOR gate from gating and the other flip-flop from changing state.

The result of this arrangement is that the flip-flops will control the detector output until the two input frequencies again coincide at which time the detector output is again controlled by the EXOR gate.

It is therefore an object of the invention to provide a new and improved digital phase-frequency detector.

It is another object of the invention to provide a new and improved digital phase-frequency detector for phase locked loops.

It is a further object of the invention to provide a new and improved digital phase-frequency detector that provides rapid acquisition time.

It is still another object of the invention to provide a new and improved digital phase-frequency detector in which capture range and lock range are equal.

It is still a further object of the invention to provide a new and improved digital phase frequency detector for phase-locked loops that eliminates any characteristic "dead zone" when the loop is in a lock mode.

It is another object of the invention to provide a new and improved digital phase-frequency detector for phase locked loops that prevents phase-jitter in the loop.

These and other advantages, objects and features of the invention will become more apparent after considering the following description taken in conjunction with the illustrative embodiment in the accompanying drawing.

DESCRIPTION OF THE PREFERRED EMBODIMENT

Figure 1:
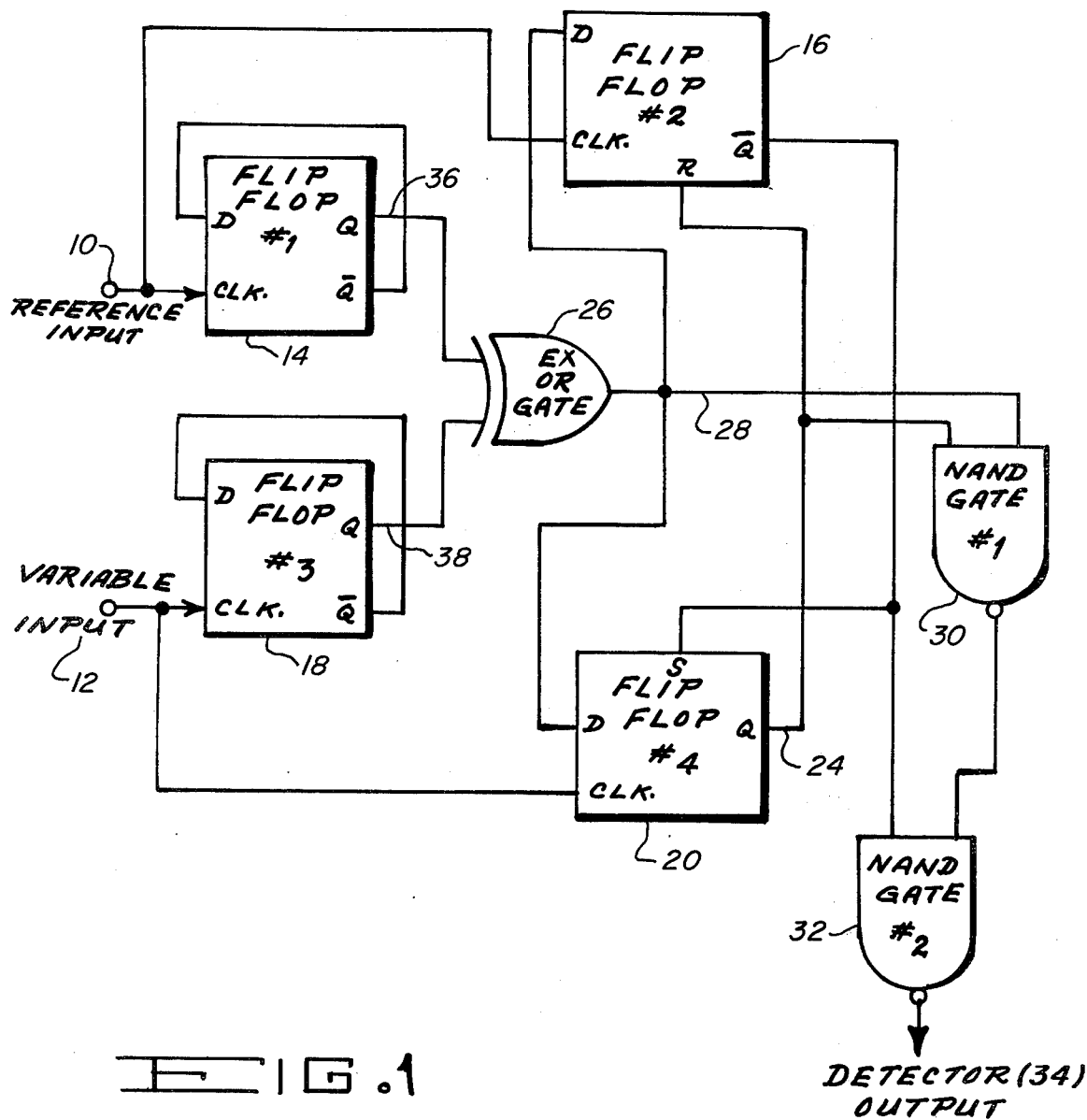
FIG. 1 is a schematic representation of the circuit of the invention.

Referring now to FIG. 1, a phase detector schematic diagram is shown. The reference input signal from the voltage controlled oscillator of the phase locked loop is shown at 10, while the variable input is shown at 12. The clocked reference signals are sent to flip-flops 14 and 16 while the clocked variable input signals are sent to flip-flops 18 and 20.

The phase-frequency detector shown is locked in, when the positive transitions of the reference input and the variable input are equal in frequency and have a phase difference of 180°. Under these conditions the $\overline{Q}$ output of flip flop 16 will be high, and the Q output 24 of flip flop 20 will also be high. This will cause the output of exclusive or (EXOR) gate 26 to be gated via line 28 through NAND gates 30, 32 to the output of the phase-frequency detector 34.

The output of the EXOR gate will be high whenever the Q output 36, of flip flop 14, is the same as the Q output 38 of flip flop 18. The output of the EXOR gate will be low when Q, 36 and Q, 38 are different.

Under a locked condition the duty cycle of this output will be fifty percent and the output frequency will be equal to the input frequency. Any change in phase will result in a corresponding linear change in duty cycle.

If the frequencies of reference input 10 and variable input 12 differ, the phase difference will increase until the higher frequency input will have two positive transitions before a positive transition on the lower frequency input can propogate through its input flip flop and the EXOR gate.

Since, in a locked condition, a positive transition on the reference (10) or variable (12) input will occur when the output of EXOR gate 26 is low and high respectfully, a double transition such as just described will result in a change of state of either flip flop 16 or flip flop 20. The flip flop that changes state will depend on which input receives a double transition. If a double transition occurs on the reference input (10) the Q output 22 of flip flop 16 will go to a low state, forcing the output 34 of the detector to a high level and also controlling flip flop 20 so no change of state can occur on its Q output 24.

If a double transition occurs on the variable input (12) the $\overline{Q}$ output 38 of flip flop 20 will go to a low state forcing the output 34 of the detector to a low level and also controlling flip flop 16. No change of state can occur on its Q output 22.

Flip flop 16 and flip flop 20 will control the output of the detector in this saturated state until the phase of the two input frequencies again lines up such that the output of EXOR gate 26 is again linearly related to the phase difference between the two input frequencies. At this time control of the detector output is transferred back to EXOR gate 26.

Figure 2:
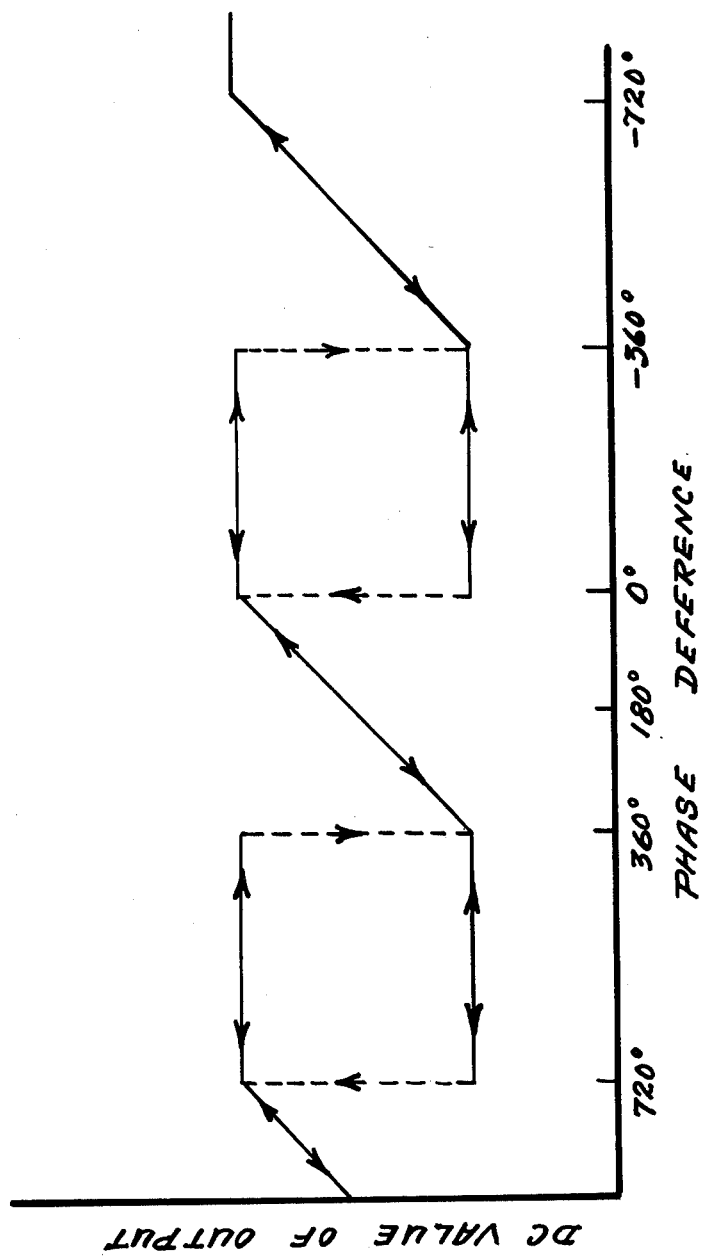
FIG. 2 is a graph illustrating the output versus phase characteristic of the digital frequency detector of the invention.

FIG. 2 illustrates the output versus phase characteristic of the invention as effected by the above described operation thereof.

Although the invention has been described with reference to a particular embodiment, it will be understood to those skilled in the art that the invention is capable of a variety of alternative embodiments within the spirit and scope of the appended claims.

I claim:

1. A digital phase-frequency detector for phase locked loops comprising: first and second signal input means; a first and second circuit means connected to the said first and second input means for determining a selected phase-frequency relationship between said input signals and producing an output; gate means for gating an output when the selected phase relationship exists connected to the first and second circuit means; third and fourth circuit means connected to the first and second input means for detecting unselected phase-frequency relationships, said third and fourth circuits being so interconnected as to disable said gate means and causing the circuit receiving the higher input frequency to change state preventing the circuit receiving the lower frequency from changing state until the selected phase-frequency relationship is achieved, and a first and second NAND gate connected to the third and fourth circuits and said gate means for allowing an output signal when said conditions are met.

2. A digital phase-frequency detector for phase locked loops according to claim 1 wherein, said gate means in an exclusive or gate.

3. A digital phase-frequency detector for phase locked loops according to claim 1 wherein, said circuit means are flip flop circuits.

4. A digital phase-frequency detector for phase locked loops according to claim 1 wherein the input signals are clocked.

5. A digital phase frequency detector comprising first and second flip flop circuits each having a delay input, a clock input, a Q output and a Q output, the Q output being connected to the delay input, a third flip flop circuit having a delay input, a clock input, a reset input and a Q output, a fourth flip flop circuit having a delay input, a clock input, a set input and a Q output, an exclusive OR gate having first and second inputs and an output, and first and second NAND gates each having first and second inputs and an output, a reference signal applied to the clock inputs of said first and third flip flop circuits, a variable signal applied to the clock inputs of said second and fourth flip flop circuits, said exclusive OR gate having its first and second inputs connected respectively to the Q outputs of said first and second flip flop circuits and its output connected to the delay inputs of said third and fourth flip flop circuits and the first input of said first NAND gate, the reset inputs of said third flip flop circuit connected to the Q output of said fourth flip flop circuit and the second input of said first NAND gate, the Q output of said third flip flop circuit connected to the first input of said second NAND gate and the set input of said fourth flip flop circuit, said second NAND gate having its second input connected to the output of said first NAND gate and providing a detector output.

* * * * *